(12) United States Patent
Alexanderson et al.

(10) Patent No.: US 11,575,398 B2
(45) Date of Patent: Feb. 7, 2023

(54) ANTENNA CONTROLLER FOR ANTENNA WITH LINEARIZED POWER AMPLIFIERS

(71) Applicant: HUAWEI TECHNOLOGIES CO., LTD., Guangdong (CN)

(72) Inventors: Mats Alexanderson, Gothenburg (SE); Hossein Mashad Nemati, Gothenburg (SE); Mark Holm, Gothenburg (SE); Le Liang, Xi'an (CN); Binbin Zhang, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 89 days.

(21) Appl. No.: 17/012,880

(22) Filed: Sep. 4, 2020

(65) Prior Publication Data
US 2020/0403649 A1 Dec. 24, 2020

Related U.S. Application Data

(63) Continuation of application No. PCT/EP2018/063576, filed on May 23, 2018.

(51) Int. Cl.
*H04B 1/04* (2006.01)
*H03F 3/19* (2006.01)
(Continued)

(52) U.S. Cl.
CPC .............. *H04B 1/0458* (2013.01); *H03F 3/19* (2013.01); *H03F 3/245* (2013.01); *H03G 3/3042* (2013.01); *H03F 2200/451* (2013.01)

(58) Field of Classification Search
None
See application file for complete search history.

(56) References Cited

U.S. PATENT DOCUMENTS

| | | |
|---|---|---|
| 3,870,957 A | 3/1975 | Straw |
| 5,644,316 A | 7/1997 | Lewis et al. |

(Continued)

FOREIGN PATENT DOCUMENTS

| | | |
|---|---|---|
| CN | 107566306 A | 1/2018 |
| EP | 3267579 A1 | 1/2018 |

(Continued)

OTHER PUBLICATIONS

Frederic Roger,"A 200mW 100MHz-to-4GHz 11th-Order Complex Analog Memory Polynomial Predistorter for Wireless Infrastructure RF Amplifiers",Scintera, Sunnyvale, CA,2013 IEEE International Solid-State Circuits Conference Digest of Technical Papers, pp. 94-96.

(Continued)

*Primary Examiner* — Pablo N Tran
(74) *Attorney, Agent, or Firm* — Womble Bond Dickinson (US) LLP

(57) ABSTRACT

An antenna controller for an antenna is configured to request and receive status information comprising power amplifier data of at least two adjustable power amplifiers. The antenna controller is configured to determine at least one target setting for the at least two adjustable power amplifiers based on the received power amplifier data, and to send the at least one target setting for the at least two adjustable power amplifiers. Hereby it is made possible for an antenna controller to set an overall target for multiple adjustable power amplifiers of the antenna. This in turn makes it possible to make the settings for the adjustable power amplifiers such that the transmission signal becomes linearized by a shared digital pre-distorter when transmitting using the multiple adjustable power amplifiers of the antenna. A Radio Frequency Integrated Circuit controller for an antenna subarray (Continued)

is configured to control at least one adjustable power amplifier.

10 Claims, 6 Drawing Sheets

(51) Int. Cl.
    *H03F 3/24*           (2006.01)
    *H01Q 3/30*          (2006.01)
    *H03G 3/30*          (2006.01)

(56) References Cited

U.S. PATENT DOCUMENTS

| | | | |
|---|---|---|---|
| 5,778,308 A | | 7/1998 | Sroka et al. |
| 10,643,962 B1* | | 5/2020 | Ichitsubo ............... H03F 3/72 |
| 11,036,262 B1* | | 6/2021 | Ichitsubo ............. G06F 1/1698 |
| 2008/0266176 A1 | | 10/2008 | Nabar et al. |
| 2011/0140772 A1 | | 6/2011 | Sengupta et al. |
| 2011/0235734 A1 | | 9/2011 | Kenington |
| 2013/0027129 A1* | | 1/2013 | Langer ................. H03F 3/245 |
| | | | 330/127 |
| 2015/0028945 A1 | | 1/2015 | Gaynor |
| 2015/0091656 A1 | | 4/2015 | Gaynor |
| 2017/0063217 A1 | | 3/2017 | Shin et al. |
| 2017/0187857 A1* | | 6/2017 | Young ..................... H03F 1/52 |
| 2017/0195972 A1* | | 7/2017 | Drogi .................... H03F 3/245 |
| 2019/0020402 A1* | | 1/2019 | Gharavi ............. H04B 7/0413 |
| 2020/0144973 A1* | | 5/2020 | Gunzner ................. H02H 9/00 |
| 2021/0242897 A1* | | 8/2021 | Arfaei Malekzadeh ................... |
| | | | H04B 1/525 |

FOREIGN PATENT DOCUMENTS

| | | |
|---|---|---|
| GB | 2476035 A | 6/2011 |
| JP | 2013130405 A | 7/2013 |
| KR | 101262169 B1 | 5/2013 |
| WO | 2017097335 A1 | 6/2017 |

OTHER PUBLICATIONS

Adrian Tang et al, "A Low-Overhead Self-Healing Embedded System for Ensuring High Yield and Long-Term Sustainability of 60GHz 4Gb/s Radio-on-a-Chip", 2012 IEEE International Solid-State Circuits Conference, pp. 316-318.

Ayssar Serhan et al, "Broadband SOI PA with Tunable Matching Network for Improved LTE Performances under High VSWR", 2016 IEEE International Conference on Electronics, Circuits and Systems (ICECS), pp. 488-491.

Han Yan et al, "Digital Predistortion for Hybrid Precoding Architecture in Millimeter-Wave Massive MIMO Systems", 2017 IEEE International Conference on Acoustics, Speech and Signal Processing (ICASSP), pp. 3479-3483.

Sangil Lee et al, "Digital Predistortion for Power Amplifiers in Hybrid MIMO Systems with Antenna Subarrays", 2015 IEEE 81st Vehicular Technology Conference, May 11-14, 2015, total 5 pages.

Nuutti Tervo et al, "Digital Predistortion of Amplitude Varying Phased Array Utilising Over-the-Air Combining", 2017 IEEE MTT-S International Microwave Symposium (IMS), Honolulu, HI, 2017, pp. 1165-1168.

Steven M. Bowers et al, "Integrated Self-Healing for mm-WavePower Amplifiers", IEEE Transactions on Microwave Theory and Techniques, vol. 61, No. 3, Mar. 2013, pp. 1301-1315.

Kaushik Sengupta et al, "On-chip Sensing and Actuation Methods for Integrated Self-healing mm-Wave CMOS Power Amplifier", 2012 IEEE/MTT-S International Microwave Symposium Digest, total 3 pages.

S. C. Cripps, "RF Power Amplifiers for Wireless Communications", Second edition, Artech House Microwave Library, 2006, total 474 pages.

3GPP TS 38.104 V1.0.0 (Dec. 2017), 3rd Generation Partnership Project; Technical Specification Group Radio Access Network;NR;Base Station (BS) radio transmission and reception(Release 15), total 123 pages.

* cited by examiner

ANTENNA CONTROLLER FOR ANTENNA WITH LINEARIZED POWER AMPLIFIERS

CROSS-REFERENCE TO RELATED APPLICATIONS

This application is a continuation of International Application No. PCT/EP2018/063576, filed on May 23, 2018, the disclosure of which is hereby incorporated by reference in its entirety.

TECHNICAL FIELD

The disclosure relates to an antenna controller and to an antenna being controlled by such an antenna controller. The disclosure also relates to an RFIC controller for an antenna and to methods for controlling an antenna and devices of the antenna.

BACKGROUND

In wireless systems for transmitting radio Frequency (RF) signals, linearization techniques are generally used in order to reduce distortion from power amplification in transmission of the RF signals. Several principles for linearization are known and have been tried for wireless applications. One of the most common is digital predistortion (DPD). In DPD, the nonlinear transfer function of a power amplifier (PA) is compensated for by applying an inverse to the PA transfer function through a digital signal processor. Over a certain dynamic range, the result is a composite linear transfer function in the analog signal domain at the RF output of the amplifier. This is illustrated in FIG. 1.

In e.g. the development of 5G mobile communications, base stations with directive antennas that use beam forming to direct the energy towards specific users are used. To facilitate rapid redirection of beams to be able to follow users in motion, active electrically scanned array (AESA) antennas have come into use. There are several variants of AESA, such as fully digital beamforming antennas (DBF), analogue beamforming (ABF) antennas, and antennas with combined analogue and digital beamforming which are often referred to as hybrid beam forming (HBF).

The HBF array is a combination of both DBF and ABF technologies and is considered as a balanced cost and performance compromise for milli-meter (mm)-wave applications. Such an array has multiple subarrays, where one separate data stream, though a Digital-Analogue Converter (DAC), feeds each subarray which uses multiple RF Transmit/Receive Modules (TRMs) for amplification and analogue beamforming. Precoding of the signal in the digital domain is used to increase the beamforming capacity and resolution.

Predistortion is widely used for compensating the inherent nonlinearities of PAs in wireless systems. While it is most common to have digital predistortion (DPD), analogue predistortion (APD) is an alternative. In all conventional systems with single input and single output (SISO), one predistortion functionality (DPD or APD) per PA is needed.

There is a need for an improved antenna and for devices to control an antenna, so that linearization can be more efficiently applied to array antennas.

SUMMARY

It is an object of the present disclosure to provide an improved control of antennas.

This object and or others are obtained in accordance with the disclosure as set out in the appended claims.

In antenna array systems with multiple antenna elements and PAs, one digital pre-distorter per PA can be used as straightforward solution to address the nonlinearity of each and every individual PA. This linearization architecture can be used in digital-beamforming (DBF) systems for RF frequencies and signal bandwidths where ADC speed and DSP performance are comparatively large. However, using one predistortion core and functionality per PA (with inherent need for one DAC, feedback ADC, down- and up-conversion mixers per PA branch) significantly add to system size and total power consumption particularly in large array systems. The cost and complexity of the architecture increases with frequency and bandwidth. Moreover, this is not an option for HBF systems where one digital data stream and one DAC supplies a shared signal to many parallel PAs. In the HBF architecture an individual DPD correction for each PA cannot be generated.

To address this particular problem with HBF array antennas, an antenna with adaptive power amplifiers (APAs) controlled by a single entity through a network with bidirectional information flow has been developed.

In accordance with a first aspect of the disclosure, an antenna controller for an antenna is provided. The antenna controller is configured to request and receive status information comprising power amplifier data of at least two adjustable power amplifiers. The antenna controller is configured to determine at least one target setting for the at least two adjustable power amplifiers based on the received power amplifier data, and to send the at least one target setting for the at least two adjustable power amplifiers. Hereby it is made possible for an antenna controller of an antenna to set an overall target for multiple adjustable power amplifiers of the antenna. This in turn makes it possible to make the settings for the adjustable power amplifiers such that the transmission signal becomes linearized by a shared digital pre-distorter when transmitting using the multiple adjustable power amplifiers of the antenna. In other words, by giving control of a multitude of adjustable power amplifiers, used to transmit a signal from the antenna, to an antenna controller setting a target for all of the adjustable power amplifiers, it is made possible to linearize the output from all of the adjustable power amplifiers working together.

In one embodiment, the antenna controller is configured to determine the target setting to equalize the nonlinear transfer functions of said at least two adjustable power amplifiers. By equalizing the nonlinear transfer functions of the adjustable power amplifiers, it is made possible to optimize the linearization of all of the adjustable power amplifiers.

In one embodiment, the antenna controller is configured to request status information of at least two adjustable power amplifiers of the antenna. Hereby, the antenna controller can be enabled to collect the power amplifier data from the adjustable power amplifiers thereby improving the antenna controller's ability to determine the target setting.

In one embodiment, the antenna controller is configured to send the at least one target setting for at least two adjustable power amplifiers to a controlling unit of at least one subarray or to a Radio Frequency Integrated Circuit (RFIC) controller. The RFIC controller can typically be a controlling unit of at least one adjustable power amplifier residing on the same chip as, or in close vicinity of, said RFIC controller. Hereby, the antenna controller is enabled to send the target setting to a unit in control of the adjustable power amplifiers.

In accordance with a fourth implementation of the first aspect, the antenna controller is further configured to command the controlling unit of the subarray or the Radio Frequency Integrated Circuit, RFIC, controller to implement the at least one target setting for said at least two adjustable power amplifiers. Hereby the antenna controller can assume control of the adjustable power amplifiers via a device controlling the adjustable power amplifiers.

In one embodiment, the antenna controller is configured to receive a target set indication that the at least one target setting has been performed. Hereby the antenna controller can be informed about actions performed for the adjustable power amplifiers and perform activities based on the received indication. For example, the antenna controller can be configured to receive the target set indication that the at least one target setting has been performed for at least two adjustable power amplifiers of at least one subarray. In accordance with some embodiments the antenna controller can be configured to initiate a measurement of the antenna upon reception of all target set indications. The antenna controller can also be configured to set the antenna to an operational mode upon receiving all target set indications. Thus, when having received a target set indication, in particular a target set indication from all entities that should report a target set, the antenna controller can be enabled to take further actions based on the information received in the target set indication(s).

In one embodiment, the power amplifier data comprises at least one of an absolute parameter and a relative parameter for each adjustable power amplifier. Thus, absolute parameters such as DC voltage and RF power, or relative parameters such as RF gain can be used. For example, if the RFIC controller uses computational capacity to calculate derived parameters from measurement on several sensors relative parameters can be used. In other exemplary embodiments raw sensor data can be sent to the superior controller such as the antenna controller who makes the computation. One example benefit from distributing the computational power to lower controller levels is to reduce the amount of data traffic on the internal bus. It is also a primary implementation aspect to design the RFIC controller with optimization capability to fulfil the APA targets, otherwise the workload for superior controllers and the amount of bus traffic would grow immensely with increasing array size. Workload distribution gives a scalable system solution.

In accordance with a second aspect of the disclosure, a Radio Frequency Integrated Circuit (RFIC) controller on an antenna subarray is provided. The RFIC controller is configured to control at least one adjustable power amplifier. The RFIC controller is further configured to receive from an antenna controller or a controlling unit of a subarray at least one target setting for said at least one adjustable power amplifier, and to control the at least one adjustable power amplifier to said at least one target setting. Hereby an RFIC controller on an antenna subarray is provided that can control an adjustable power amplifier based on settings received from another, controlling, entity. This makes it possible to control multiple adjustable power amplifiers of an antenna to make their nonlinear transfer functions aligned to each other. This is made possible by letting a common controlling entity control multiple adjustable power amplifiers.

In one embodiment, the RFIC controller is configured to receive a target output impedance state for the at least one adjustable power amplifier and further configured to control at least one variable impedance matching network of the at least one adjustable power amplifier based on the target output impedance state or based on the power amplifier data. Hereby a matching network of the adjustable power amplifier can be controlled in a fast way to compensate for rapidly changing output load impedances to an adjustable power amplifier.

In one embodiment, the at least one adjustable power amplifier is provided with at least one measurement sensor for at least one performance parameter, and wherein the RFIC controller is configured to send power amplifier data from the at least one measurement sensor of the at least one adjustable power amplifier to the antenna controller or to the controlling unit of a subarray. Hereby data measured by an adjustable power amplifier can be sent to a controlling entity such as an antenna controller or a sub-array controller. This makes it possible to relay data that can be used to control multiple adjustable power amplifiers to a control unit controlling many, and in particular all, adjustable power amplifiers of an antenna.

In one embodiment, when the at least one adjustable power amplifier is provided with at least one variable voltage or current setting control parameter, the RFIC controller is configured to receive a target performance parameter for the at least one adjustable power amplifier and further configured to control the variable voltage or current parameter of the at least one adjustable power amplifier based on the at least one target setting for said at least one adjustable power amplifier. Hereby an implementation of the control of the adjustable power amplifier is achieved.

In one embodiment, the RFIC controller is further configured to receive a request for power amplifier data of said at least one adjustable power amplifier, and to send a response to said request for power amplifier data of said at least one adjustable power amplifier. Hereby an implementation of a mechanism for reporting power amplifier data can be implemented that allows for a high-level control of the adjustable power amplifiers of an antenna.

The disclosure also extends to an antenna comprising an antenna controller and/or an RFIC controller as set out above. The antenna can comprise at least one subarray where each subarray is driven by one Digital to Analogue converter and where each subarray comprises at least two adjustable power amplifiers.

The disclosure also extends to methods performed in an antenna controller for controlling adjustable power amplifiers of an antenna in accordance with the above.

The disclosure also extends to methods performed in an RFIC controller for controlling adjustable power amplifiers of an antenna subarray in accordance with the above.

BRIEF DESCRIPTION OF THE DRAWINGS

The disclosure will now be described in more detail, by way of example, and with reference to the accompanying drawings, in which.

DETAILED DESCRIPTION

Figure 1:
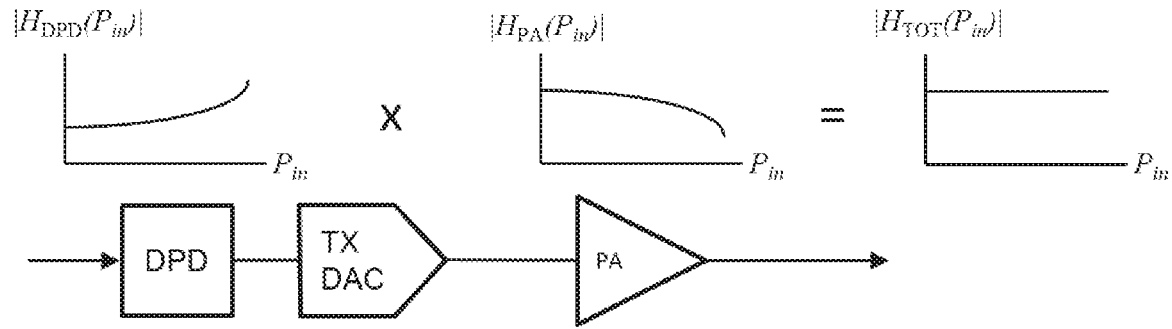
FIG. 1 is a view illustrating linearization of a transfer function for a power amplifier.

The disclosure will now be described in detail hereinafter with reference to the accompanying drawings, in which certain embodiments of the disclosure are shown. The disclosure may, however, be embodied in many different forms and should not be construed as limited to the embodiments set forth herein; rather, these embodiments are provided by way of example so that this disclosure will be thorough and complete, and will fully convey the scope of the disclosure to those skilled in the art. Like numbers refer to like elements throughout the description.

Since mm-wave amplifiers are generally characterized by pronouncedly increasing distortion as RF power approach the operating region of good efficiency, there is a clear incentive to try to improve performance by applying linearization also for active mm-wave array antennas.

Since digital predistortion as a linearization method has proven to be implementable and efficient for single amplifiers in the mm-wave range, it becomes attractive for use also in active arrays.

Because RF performance variations due to semiconductor process variations increase for mm-wave amplifiers compared to amplifiers for lower frequencies and because the process parameter variations as such also tend to increase for semiconductor processes when their geometries get scaled to finer dimensions, such as in submicron CMOS processes, the likelihood of a group of mm-wave amplifiers of the same type to have exactly the same transfer function is low.

It is clear that the linearity improvement brought by any type of predistortion is greatly dependent on having the correct information about the amplifier nonlinear transfer function supposed to compensate for.

Because the hybrid beamforming architecture builds upon driving groups of parallel amplifiers with a common signal generated from one DAC per group, it is the composite nonlinear transfer function for such a group the digital pre-distorter sets up to compensate. If the transfer functions for the individual amplifiers within the group show a great spread, the one compensation that the DPD can set up will be a poor representation of the inverse transfer function for most amplifiers. This creates a problem both with collecting representative information from the output signal for a feedback correction and with applying a representative inverse transfer function for predistortion.

There is therefore a need for a method that can execute alignment of the amplifiers in the array antenna, so that for any given set of amplifiers assembled into the antenna and under any operational condition, their nonlinear transfer functions become as similar as possible. Under this aligned condition, linearization using digital predistortion can achieve increased performance.

A group of antenna elements that is driven by signals generated by a common source in the form of one single D/A converter (DAC) is called a subarray. The subarray of a hybrid beamforming transmit antenna array has a phase and amplitude shifting network and a number of supposedly equal, parallel amplifiers.

Figure 2:
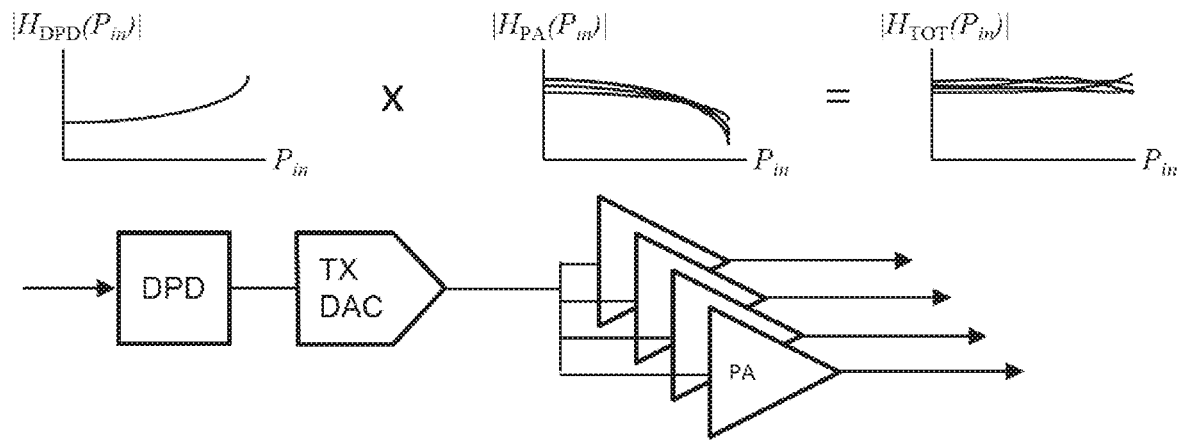
FIG. 2 illustrates conventional distortion cancelling from an antenna.
Figure 3:
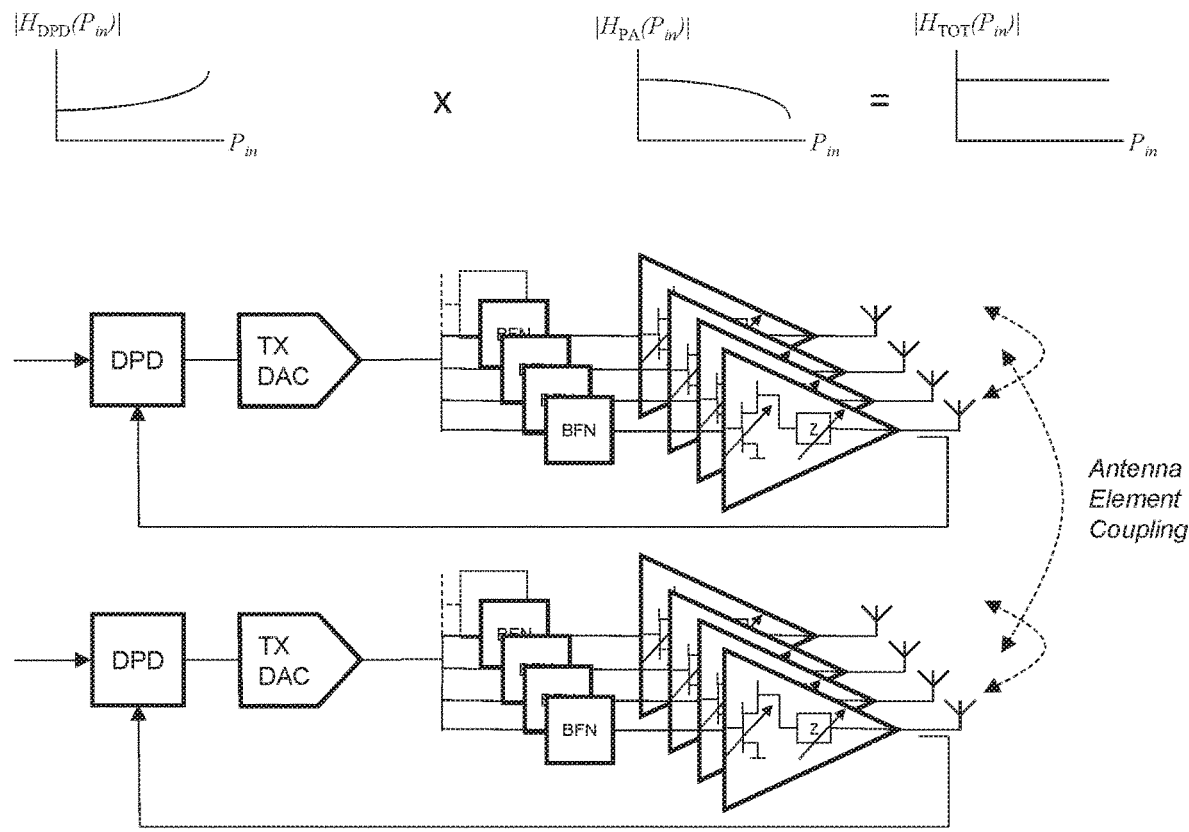
FIG. 3 is a view of two subarrays on an antenna in accordance with an embodiment of the disclosure.

However, the different amplifier individuals in the same system are unlikely to exhibit the same nonlinear transfer function from input to output. The die-to-die and device-to-device variations are either due to the commonly existing semiconductor component manufacturing and process spread, due to temperature spread across array, and to different component aging rates. These are inevitable variations among the PAs and, therefore, their nonlinear transfer functions will not be all identical. In HBF array systems, one digital data stream is used per subarray and the same signal is split to several amplifiers. Since DPD compensation is applied to the digital signal before the DAC common to the subarray, such a single compensation function cannot, at the same time, linearize the different nonlinear function of all PAs. The result is a non-optimal distortion cancelling when measuring the signal in the air interface in front of the antenna. This is shown in FIG. 2.

Further, in array antennas, coupling between the antenna elements combined with beam steering to large angles result in reverse power entering the output of the amplifier. This is power coupled to one antenna element from all the surrounding antenna elements simultaneously transmitting. The effect varies with beam angle excitation and manifests as a rapidly changing, dynamic variation of the complex load impedance to each amplifier. Since the load impedance for the amplifier affects its nonlinear transfer function, this further enhances the inequality between the amplifiers and changes the conditions for the DPD. Depending on the beam steering angle this active load affects some amplifiers on the array more than others. Thus, if a system uses only one feedback pickup point for the DPD, the pre-distorter can be largely misled and even degrade performance.

For successful implementation of DPD on an HBF active array antenna, both these problems need to be addressed in one unified solution. Since the problems appear on very different time scales, the solution preferably requires different methods to be concurrently applied.

High-efficiency mode amplifier concepts, such as Doherty or out-phasing amplifiers, are particularly sensitive to varying load impedances and risk to lose their potential advantage when used in a high frequency array antenna. Usually, high-efficiency PA modes are also inherently more nonlinear and therefore the need for predistortion, in order to secure linearity requirements, is greater.

In accordance with some embodiments, an antenna is provided that can use a two-layer correction to establish a condition where all amplifiers in the array have their nonlinear transfer functions made equal. The first functional layer as described herein uses adjustable power amplifiers with coordinated control to align their permanent and slowly changing variations of their transfer functions to make them more alike.

Time varying active load impedance on the amplifier outputs is a phenomenon, typical for array antennas, that also affects the nonlinear transfer functions of the amplifiers. This load variation is typically a function of both the applied analogue beamforming and digital beamforming and is therefore data and precoding dependent.

Therefore, to improve performance enhancement of the antenna, a second functional layer can be used to compensate for rapidly varying active load effects by dynamic retuning of the output matching networks of the power amplifiers. Thus, it is possible to increase the output power and to reduce the distortion of the antenna under active load conditions caused by antenna element coupling effects.

Figure 4:
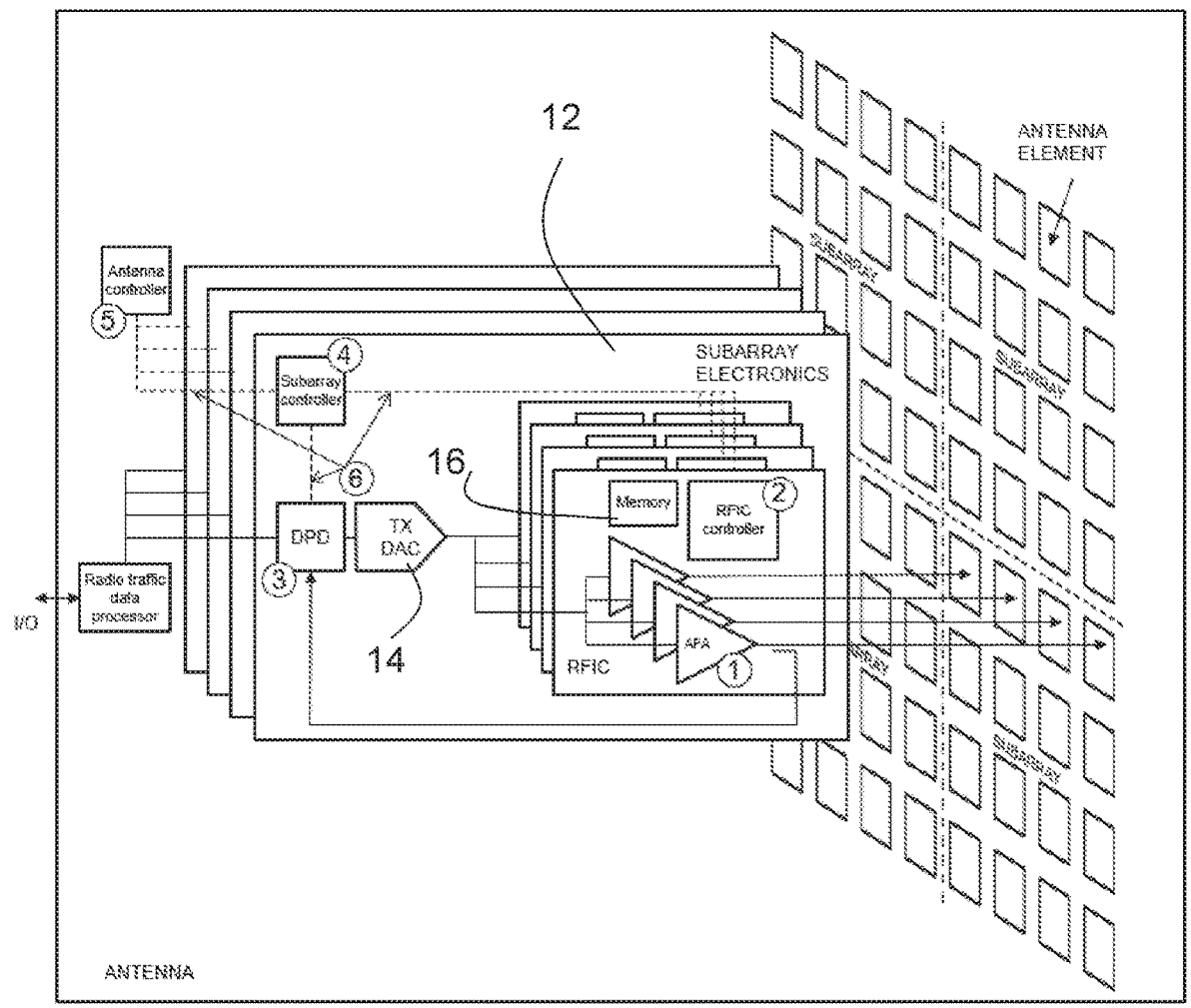
FIG. 4 is a view of an antenna in accordance with an embodiment of the disclosure.

In FIG. 4 an exemplary implementation of a transmit antenna 10 in accordance with the above is depicted. The antenna 10 comprises an array antenna transmit section having M×N×L antenna elements, where M is the number of subarrays, equal to the number of independent digital data streams. N×L is the number of antenna elements per subarray. N is the number of Radio Frequency Integrated Circuits (RFICs) containing transmit sections, and L is the number of transmitter channels per RFIC, each channel equipped with one Adjustable Power Amplifier, APA, 1.

An APA is a power amplifier whose transfer function properties can be adjusted in some manner. Typically, an APA can comprise means for adjustment of the gain and degree of nonlinearity of the APA. Here these adjustment "knobs" are referred to as actuators. The actuators can affect an RF parameter such as gain either directly, e g through varying the attenuation of a variable attenuator circuit integrated into the amplifier, or indirectly, e g through varying DC bias voltages or currents for transistor devices in the amplifier. The concept of an adjustable amplifier with actuators can be extended to an amplifier used together with circuit elements for analogue predistortion, where these predistortion circuits have a degree of adjustability through control parameters.

In accordance with some embodiments, the APAs can contain built-in sensors, configured to measure one or more of, but not limited to, the following parameters: The RF input power, the RF power of the forward (outgoing) wave at the output as well as the reverse (reflected) RF power, DC bias currents and voltages to different transistor devices in the amplifier and also local temperature at different positions on the chip. The directly sensed parameters can be referred to parameters of measurement (POM), which can be translated or correlated to parameters of interest (POI) such as gain, IM3 rejection, amplifier efficiency et cetera.

In accordance with some embodiments, the APAs can also be provided with electrically tuneable impedance matching networks. Such a network at the output of the amplifier can be used to tune the impedance matching between the output transistor devices of the amplifier and the load connected to the amplifier.

In accordance with some embodiments of the APA, the output signals from the sensors can be converted from analogue to digital domain by ADCs and the control signals to the actuators converted from digital to analogue domain by DACs; these ADCs and DACs being located in close vicinity to the sensors and actuators as to become an integral part of the amplifier design. Thus, the APA can lend itself to integration into a control system using digital input/output communication with the APA from a controlling device.

Each RFIC is provided with a RFIC controller 2. In embodiment of FIG. 4, each RFIC comprises L transmit (TX) APAs 1. Besides the APAs, other circuits such as Beam Forming Networks (BFN), power splitters and combiners, receivers, switches and mixers may also be present on the RFICs although they are not within the scope of the disclosure. The RFIC controller 2 can for example be implemented as a programmable microcontroller or as a Field Programmable Array (FPGA) circuit block. The RFIC controller 2 can be configured to execute measurement and adjustment of sensors and actuators of the APAs 1 through ADCs and DACs also residing on the RFIC, preferably, as described above, closely integrated with the APAs.

The RFIC controller 2 can further be configured to send and to receive data and instructions over a data bus 6. Thus, the RFIC controller 2 can communicate with other entities of the antenna 10 via the data bus 6. In particular, the RFIC controller 2 can be configured to communicate with a subarray controller 4 and/or directly with the antenna controller 5. In accordance with some embodiments, the RFIC controller 2 can also be programmed to implement an optimization engine, which according to an optimization algorithm adjusts the APA actuators based on readings of the APA sensors to fulfil a POI or POM target value that has been sent to the RFIC controller over the data bus 6. This will be described in more detail below. In some embodiments, the RFIC controller 2 can be connected to an on-chip memory 16 which can be set to store e g predefined settings for actuators, target values or other parameters for which the system can be made more efficient using local storage.

In yet some embodiments, this on-chip memory can be of non-volatile type and be programmed already in the on-wafer test during chip production with calibration data from that measurement. By bringing this data into the antenna already with its assembly, antenna system calibration can be simplified, time-shortened or even eliminated.

For each subarray 12, an adaptive, feed-back Digital Predistortion (DPD) signal processor 3 is provided. The feedback signal to the DPD signal processor 3 shall represent the combined signal from the entire subarray. Since this signal is combined only first in the air in front of the antenna, it becomes clear that such a feedback is difficult, if not impossible, to arrange. The averaging aspect of the feedback can to some extent be satisfied by probing the signal at the output of each amplifier, or at least several points on the antenna feeding network, and combining the signals for the feedback to the DPD. This requires a large feedback signal network to be implemented on the antenna substrate. There is also need for down-conversion mixers from mm-wave RF to baseband for this network. In total, such a network becomes complex to design, requires more PCB layers and electronics hardware and adds significant cost, space requirements and power consumption to the antenna. It is typically a benefit if the DPD can operate well using a feedback signal taken from only one of the amplifier outputs on the same subarray 12.

An advantage of the antenna as set out herein is that after the alignment provided by the first functional layer and the active load compensation provided by the second functional layer, probing the output signal after one of the amplifiers gives as representative a feedback signal to the DPD as probing after any other one of the amplifiers on a subarray. Thereby, the average output signal from the entire subarray becomes reliably predictable from a single probed output signal.

In accordance with some embodiments, a controlling unit 4 of a subarray is provided. The controlling unit 4 can be implemented by a microcontroller on each subarray. The controlling unit 4 can be configured to coordinate instructions and information within a subarray 12 and relay to and from the antenna controller 5. The controlling unit 4 can also be configured to coordinate the linearization process with the operation of the DPD signal processor 3 of the subarray 12. The controlling unit 4 can alternatively be integrated into the DPD signal processor 3. To make the computational burden of the RFIC controller 2 less, and thus to save chip area and energy, the controlling unit 4 can in accordance with some embodiments be configured to process translation calculations between POMs and POIs.

The antenna controller 5 is configured to control the overall output from the antenna 10. The antenna controller can for example be configured to supervise the status for the linearity of the entire antenna and control the adjustment procedure of all APAs in the antenna by setting suitable targets for the adjustment to achieve an aligned state. The antenna controller 5 can when exercising control of the antenna 10 collect data such as the POI data described above from all APAs 1. The antenna controller 5 can further be configured to analyse the collected data and to calculate one or many statistical parameters based on the collected data. The statistical parameters can be used for setting targets for the APAs 1.

The data sent between the different controlling entities 2, 4, and 5 of the antenna can use a common data bus 6. The data bus 6 can be configured as a hierarchical data communication network which enables transfer of data and instructions between all RFIC controllers 2 and the subarray controlling units 4 and between the subarray controlling units 4 and the central antenna controller 5. In embodiments with no subarray controlling units 4, the antenna controller 5 can be configured to communicate directly with the RFIC controllers 2 via the data bus 6.

The fact that the antenna controller handles the information and sets the targets relieves the executers of the adjustments; the RFIC controllers 2, from continuously negotiating with each other over the communication bus 6, something that would lead to intense signalling and time-consuming convergence. Such a process would scale inefficiently with increased antenna size.

Furthermore, the fact that the antenna controller 5 does not control the target optimization of the APAs 1, but rather delegates this task to the RFIC controllers 2, also significantly reduces the data traffic on the communication bus 6 and enables efficient scaling with increased antenna size.

Figure 5:
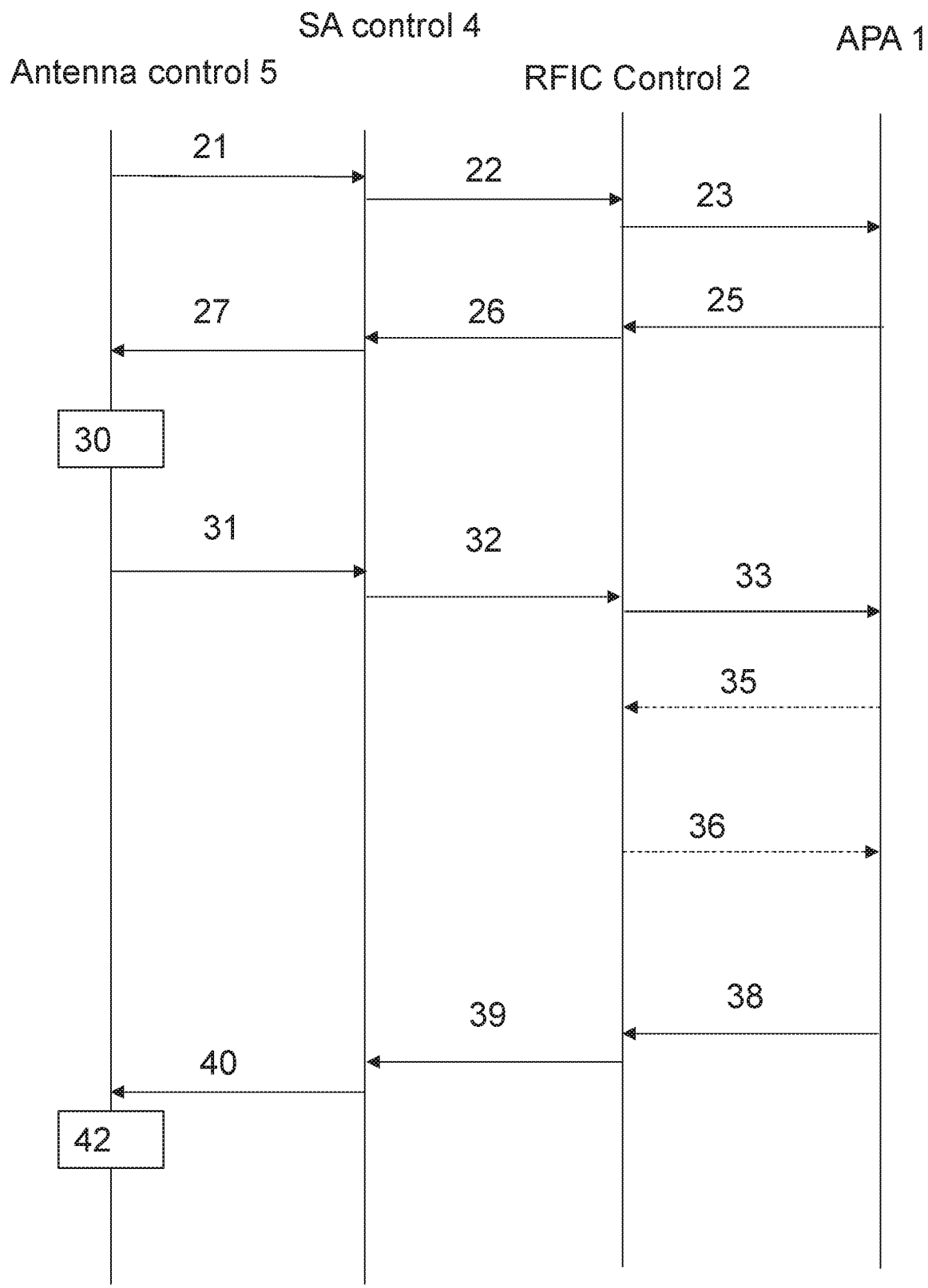
FIG. 5 is a signaling diagram illustrating signaling that can be performed in an antenna in accordance with the embodiment depicted in FIG. 4 to implement a first functional layer of the disclosure.

In FIG. 5, an exemplary process for aligning the transfer functions of the APAs 1 is depicted. An aim of the alignment is to align the different amplifier circuits to compensate for variations of the APAs such as the chip's own process, voltage and temperature (PVT) variations, variations due to ageing at different rates, and also to compensate for potential internal full or partial damage to single transistor devices due to latent ESD damage or other cause; all of these being static or slowly changing processes. Thus, the execution of the alignment process of FIG. 5 is implementing functional layer 1 as set out above.

The exemplary process of FIG. 5 can be used to check the state of the antenna 10 and make the alignment effort based upon the actual abilities (the actuation range) of all its adjustable power amplifiers 1.

An occasion when alignment of the array of the antenna 1 is required is at power-up for the first time in a field deployment. Other occasions can for example be after changes in the environment detected by the antenna or after changes from ageing of significant size. The antenna controller 5 starts by sending a request 21, 22 for status information to the RFIC controller 2, which initiates measurement of all APAs 1, engaging the sensors of the APAs. The request can either be send directly to the RFIC controller 2 or via a subarray controlling unit 4 when such an entity is provided. The antenna controller 5 can also set a dedicated test signal waveform.

The RFIC controller 2 collects sensor data from its underlying APAs 1 via a request 23 and a response 25 from the APAs 1. In an embodiment where the subarray controller 4 assists with POI computing, the response is sent to the subarray controlling unit 4 in a message 26 to further be processed to a message 27 but can also be sent directly back to the antenna controller 5. By sending the message 26 to the subarray controlling unit 4 further processed calculations can be transferred from the RFIC level thereby saving resources and workload at the RFIC level.

The subarray controlling unit 4 calculates desired parameters such as gains and linearity values for each APA on its territory and reports the values up to the antenna controller 5 is report message 27.

The antenna controller 5 calculates statistic parameters for the antenna 10 and decides a common self-healing goal function for the APAs 1 on the antenna 10 in a process operation 30. Thus, the antenna controller 5 the antenna controller determines a target setting to equalize the transfer functions of the adjustable power amplifiers 1.

Based on this data processing the antenna controller 5 sends a target setting in a message 31 for the APAs 1. In particular, the target setting can be sent to all APAs of the antenna 10. For example, the antenna controller 5 can issue global optimization targets for POMs or POIs and send these targets to the RFIC controllers 2 together with an instruction to start optimization of all APAs on each RFIC towards the targets. The message 31 can be sent to subarray controlling units 4. In such an embodiment, the subarray controlling units can translate the POI goals into direct POM values for the APAs 1 and send these values to the RFIC controllers 2 along with a request to start self-healing in a message 32. The RFIC controller 2 can be configured to activate an optimization engine to adjust actuators for minimizing the error between sensed values and targets of the APAs 1 in an operation 33. In other words, the RFIC controller control the adjustable power amplifier 1 to the received target setting from the antenna controller 5. This process could either be implemented as to follow a suitable optimization algorithm, or as a brute-force approach, in which all states are tested and the one is selected.

The APAs 1 report back in a message 38. The procedure for optimization can be an iterative procedure as indicated by messages 35, 36.

When the optimization has been performed this is signalled back towards the antenna controller in a message 39 possible via a subarray controlling units 4 in a message 40. When all RFIC controllers 2 have reported ready, the antenna controller 5 can decide to either go directly into operation, i.e. put the antenna into an operational mode and start transmitting data using the antenna 10 or perform a follow-up check and measure itself once more to verify that performance variation is low enough. This is performed in a process operation 42. If the performance standard deviation is considered not small enough, the antenna controller 5 can set new optimization targets and repeat the alignment procedure of operations 21-40.

With á priori information about the adjustment range, or actuation space, for the steerable parameters of the particular APA design with which the antenna is equipped, the target setting can be adapted to quickly achieve a converged state in only one iteration. With little, or no such information the alignment procedure may have to be repeated several times with successive target adjustment. Such information can e.g. be retrieved from measurements in chip production and the quality of the information gradually enhanced as more and more units are produced. Typically, it is more important that the result shows a low spread after alignment than it is to show the lowest measured distortion.

As long as the antenna controller 5 does not command a new alignment, the optimization targets for the APAs 1 remain valid. They can be stored into RFIC memory 16 and the RFIC controller 2 can, in some embodiments, use the information for state-changing or re-optimization during traffic. The POMs can however typically only be measured using a test input signal.

To further improve the performance of the antenna 10, the antenna 10 can be configured to compensate for the effects of active impedance loading of the amplifier that occurs in an antenna array. This effect appears because the antenna elements couple energy between each other and because all antennas transmit at the same time. One antenna element receives coupled energy from many surrounding antenna elements. This coupled energy creates a reverse signal directed into the output of the APA driving the first antenna element. This is equivalent to a change in load impedance from what would have been presented to the APA from a single antenna element.

If the load impedance moves away from the optimum point, the output power will reduce and the generated distortion will increase. To recover from this effect, the antenna can be configured to retune the PA output match. This procedure implements the second functional layer. The timescale for the corrections have to follow the input signal and the rate of changing beam directions on the antenna. Compared to the slow operation of the first functional layer, this typically requires very rapid adjustments and a different type of control procedure.

For this purpose, the APA 1 can for example be equipped with a bidirectional detector on its output, enabling the simultaneous power measurement during transmit of the forward wave and the reverse wave between the APA and the antenna. A scalar, weighted function can then be composed from the two power magnitudes from which the load situation for the amplifier can be determined, and also be used as a target function for optimization of the tuneable matching network (TMN).

Many types of signals for the operational mode of the antenna are pulses of short duration, which can also change type and characteristics from one transmit pulse to another. Thus, there may be too little time for any adaptation of the APA to the active impedance load to be made in real time. In such a case the settings for the TMN can for example be found with help from a training phase, in which all antenna beam positions are cycled through while transmitting a suitable test signal. For each beam position, the optimum TMN setting is determined by the RFIC controller 2, based upon sensor data from its underlying APAs 1, and stored in the antenna controller 5. When the antenna is in operational mode, the normal procedure is that new beam control data, i.e. phase shifter and attenuator settings, is sent to the beamforming networks preceding each power amplifier for each transmit instant. These beamforming networks reside on the same RFIC as the APAs or in close vicinity to it. With the addition of active load compensation, the TMN settings for a particular antenna beam position is fetched from the table created during the training phase and sent along with the beam control data from the antenna controller 5 to the RFIC controller 2. The RFIC controller 2 then implements both the beamforming by setting phase shifters and attenuators and the active load compensation by setting the TMN position for each APA 1.

Figure 6:
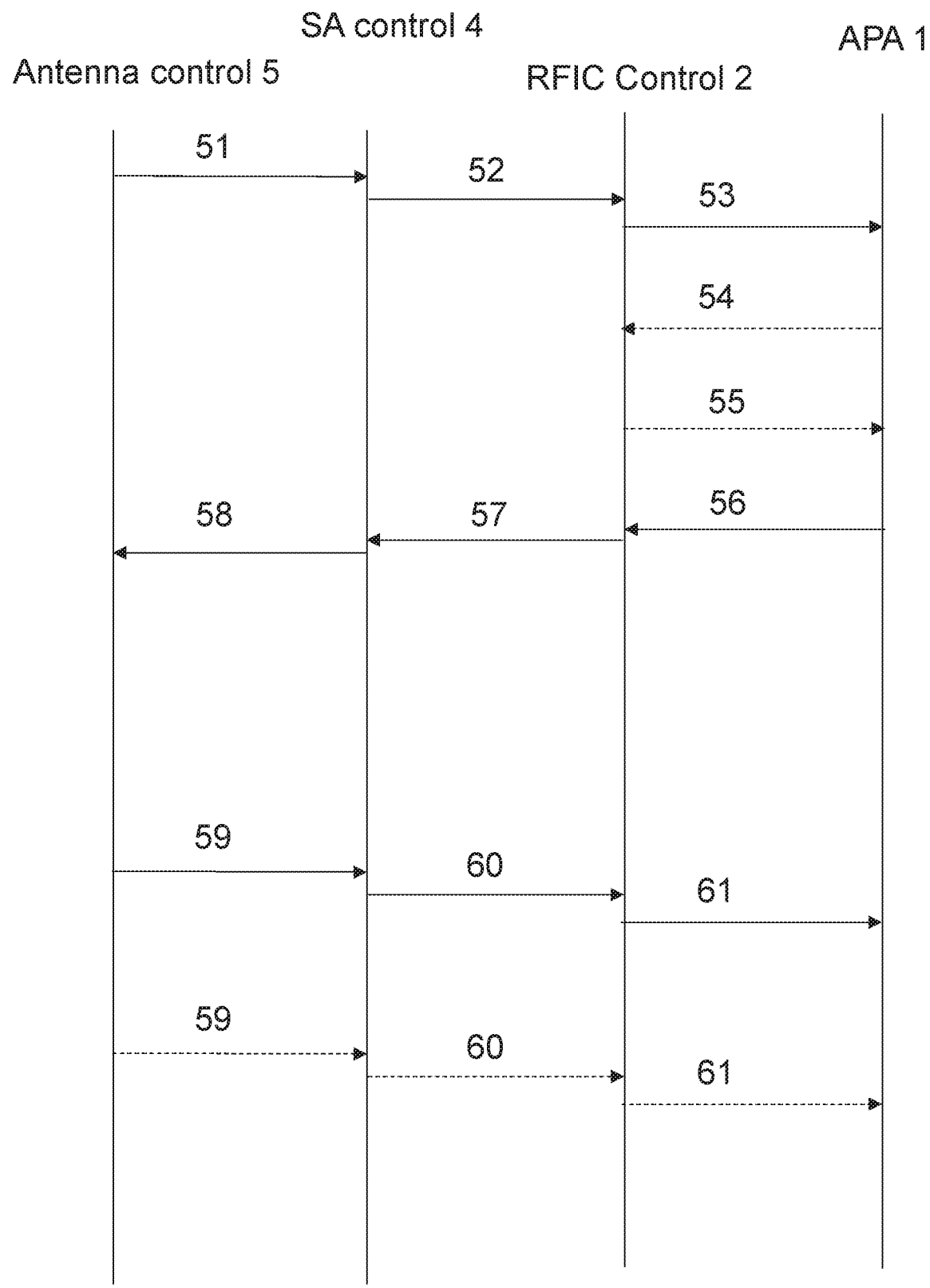
FIG. 6 is a signaling diagram illustrating signaling that can be performed in an antenna in accordance with the embodiment depicted in FIG. 4 to implement a second functional layer of the disclosure.

FIG. 6 illustrates a training phase. The antenna controller 5 sends out beam control data together with a request for optimization of the TMN in a message 51, which is relayed by the subarray controller 4 in a message 52 to the RFIC controller 2. The RFIC controller sets the beam position for each BFN and starts the optimization of the TMN state in each APA 1. It sends a TMN state to be set by the APA in a message 53, the measured response is sent back in a message 54, a new state is tried in message 55 and an iterative process repeating operation s 54, 55 is run until the optimum TMN state is found for that beam position. After the final sensor data representing the TMN position have been reported in a message 56, this information is relayed up to the antenna controller 5 in messages 57, 58.

The whole sequence 51-58 is repeated for each beam position that shall be evaluated in the training process. After completion, there is a full look-up table for TMN states vs. beam positions in the antenna controller 5.

During operational mode, the antenna controller 5 sends, for each transmit instant that so requires, beam position data and associated TMN state date fetched from the table derived during the training process in a message 59 to each subarray controller 4. The subarray controller relays the message 60 to each RFIC, which executes settings of the BFN (phase shifters, attenuators) and the TMN states of the APA in a control message 61. This is a one-directional communication only and there is no response expected from the APA 1 in this case. The setting is valid until the antenna controller 5 decides on a new beam position, for which the operation sequence 59-61 is performed again.

Figure 7:
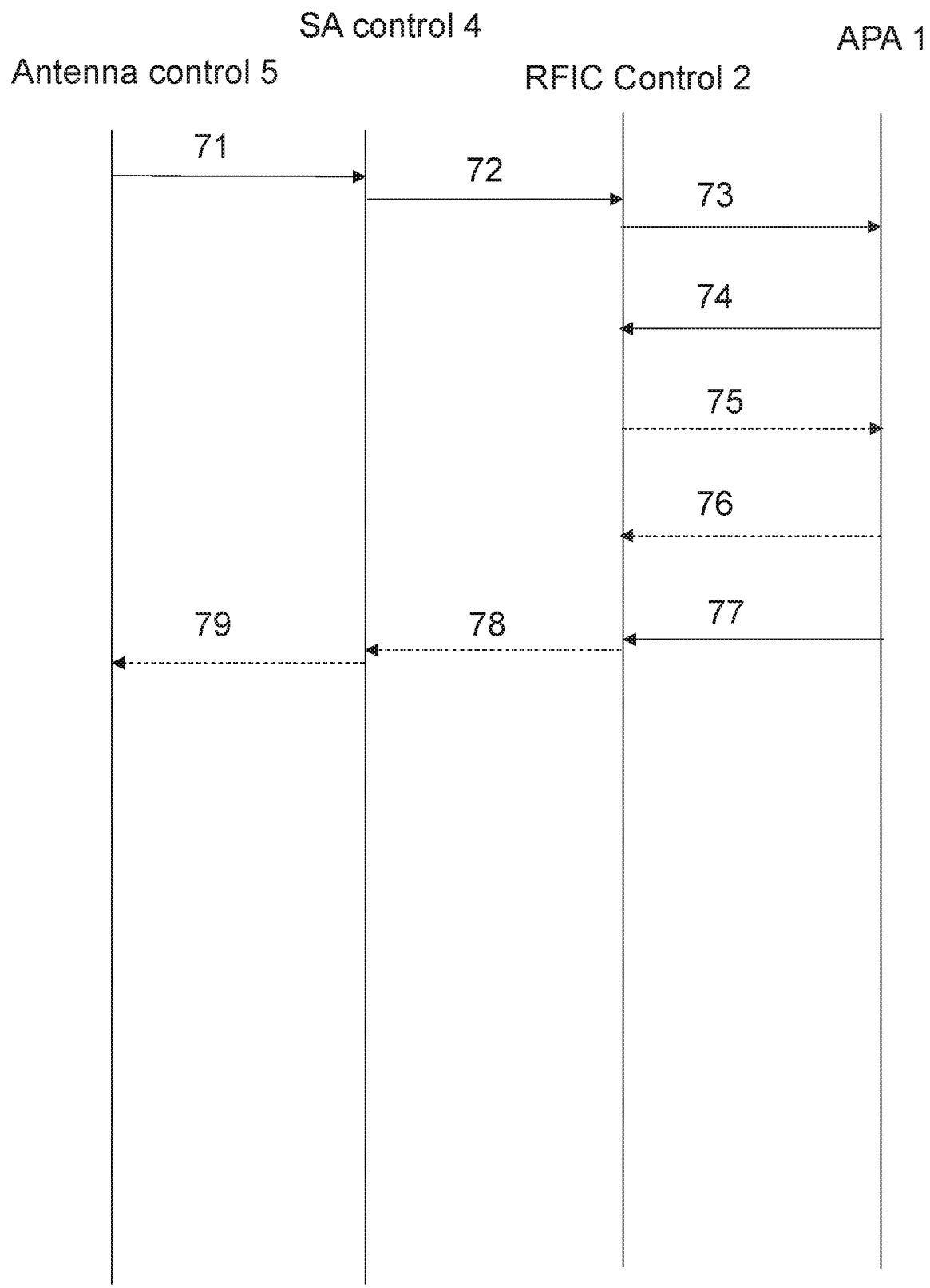
FIG. 7 is a signaling diagram illustrating signaling according to an alternative method that can be performed in an antenna in accordance with the embodiment depicted in FIG. 4 to implement a second functional layer of the disclosure.

Should the signal to transmit in operational mode have a long duration, and if the signal type so permits, there may be time enough for the optimization of the TMN to take place in real time. FIG. 7 illustrates a signalling procedure for this case. The antenna controller 5 sends beam position data for the transmit instant to begin, along with a request to the RFIC controller to perform TMN optimization in a message 71. It is relayed by the subarray controller 4 as a new message 72 to each RFIC controller 2. The RFIC controller requests measurement from the bidirectional power detector on the APA in a message 73, receives a first response in a message 74. An iterative process of optimization is started with repeated signalling in messages 75, 76 until an optimum TMN state is found and reported in a final message 77 from the APA 1 to the RFIC controller 2. This state may optionally be reported to the antenna controller in messages 78, 79, but it is also possible that no reporting upwards takes place.

Thus, the RFIC controller 2 can be configured to receive a target beam control state for the beamforming network of phase shifters and attenuators and take the responsibility to continuously control a variable impedance matching network of the adjustable power amplifier 1 based on power amplifier data. The impedance matching in operation s 73-77 is preferably performed continuously when the APAs 1 of antenna 10 have been aligned but could be performed at any time.

Thus, the antenna 10 can have a capability to adjust for very local changing conditions like output impedance mismatch at a particular antenna element, or partial transistor device damage in a particular amplifier.

This mode of operation delegates the responsibility for finding the optimum tuning of the output matching of APAs 1 to each RFIC controller 2. Thus, this mode has good properties of scaling and does not lead to more work for the antenna controller 5, nor to excessive data traffic on the communication bus 6, if the antenna size is increased.

In operation the antenna 10 can align the static and the slowly varying differences of the amplifiers 1 of the subarray 12 and of the antenna 10 through implementation of the first functional layer. It can also restore the optimum output load impedance for each amplifier 1 upon changes to the load impedance due to antenna element coupling and signal-dependent beam-forming, either in a feedforward mode through a look-up table-based procedure where the table is first established under a training phase, or in an adaptive mode where the RFIC controller 2 runs a continuous process of optimizing the output match of the APAs 1 during transmit. This optimum load restoration implements the second functional layer. Now, a single feedback signal can then be used as a highly accurate representation of the output signal from all the amplifiers 1. By having reached this condition, the corrective predistortion applied by the Digital Predistortion, DPD, signal processor 3 becomes valid for all amplifiers on the subarray. Transmit quality parameters such as Adjacent Channel Leakage Ratio (ACLR) and Error Vector Magnitude (EVM) can reach lower values than by using conventional methods for HBF array DPD linearization.

As yet a beneficial effect, the antenna as described herein can increase the system's ability for graceful degradation. Partial failures of amplifiers or devices within amplifiers can get worked around by re-balancing the bias through the described alignment procedure, combined with re-tuning the output match through the described procedures of active impedance load compensation.

The invention claimed is:

1. An antenna controller for an antenna, the antenna controller being configured to:
   receive status information comprising power amplifier data of at least two adjustable power amplifiers,
   determine at least one target setting for the at least two adjustable power amplifiers to equalize transfer functions of the at least two adjustable power amplifiers based on the received power amplifier data, and
   send the at least one target setting for the at least two adjustable power amplifiers-.

2. The antenna controller according to claim 1, wherein the antenna controller is configured to request the status information of the at least two adjustable power amplifiers of the antenna.

3. The antenna controller according to claim 1, wherein the antenna controller is configured to receive a target set indication that the at least one target setting has been implemented for the at least two adjustable power amplifiers.

4. The antenna controller according to claim 3, wherein the antenna controller is configured to receive the target set indication that the at least one target setting has been implemented for the at least two adjustable power amplifiers of at least one subarray.

5. The antenna controller according to claim 1, wherein the power amplifier data comprises at least one of:
   an absolute parameter, or
   a relative parameter,
   for each adjustable power amplifier.

6. A method in an antenna controller for controlling adjustable power amplifiers of an antenna, comprising:
   receiving status information comprising power amplifier data of the at least two adjustable power amplifiers;
   determining at least one target setting for the at least two adjustable power amplifiers to equalize transfer functions of the at least two adjustable power amplifiers based on the received power amplifier data; and
   sending the at least one target setting for the at least two adjustable power amplifiers.

7. The method according to claim 6, further comprising requesting the status information of the at least two adjustable power amplifiers of the antenna.

8. The method according to claim 6, further comprising receiving a target set indication that the at least one target setting has been implemented for the at least two adjustable power amplifiers.

9. The method according to claim 8, wherein the receiving the target set indication that the at least one target setting has been implemented for the at least two adjustable power amplifier comprises receiving the target set indication that the at least one target setting has been implemented for the at least two adjustable power amplifiers of at least one subarray.

10. The method according to claim 6, wherein the power amplifier data comprises at least one of:
    an absolute parameter, or
    a relative parameter,
    for each adjustable power amplifier.

* * * * *

UNITED STATES PATENT AND TRADEMARK OFFICE
CERTIFICATE OF CORRECTION

PATENT NO. : 11,575,398 B2
APPLICATION NO. : 17/012880
DATED : February 7, 2023
INVENTOR(S) : Mats Alexanderson et al.

It is certified that error appears in the above-identified patent and that said Letters Patent is hereby corrected as shown below:

In the Claims

In Claim 1, Column 13, Line 32, delete "amplifiers-." and insert --amplifiers.--.

Signed and Sealed this
Ninth Day of May, 2023

Katherine Kelly Vidal
*Director of the United States Patent and Trademark Office*